United States Patent
Chang

(10) Patent No.: US 8,189,327 B2
(45) Date of Patent: May 29, 2012

(54) ELECTRONIC DEVICE AND RETREATING APPARATUS THEREOF

(75) Inventor: Hsing-Min Chang, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 283 days.

(21) Appl. No.: 12/662,789

(22) Filed: May 4, 2010

(65) Prior Publication Data

US 2010/0315766 A1    Dec. 16, 2010

(30) Foreign Application Priority Data

Jun. 12, 2009   (TW) .............................. 98119770 A

(51) Int. Cl.
*H05K 5/00* (2006.01)
*H05K 7/00* (2006.01)

(52) U.S. Cl. ......... 361/679.31; 361/679.01; 361/679.02; 361/679.32; 361/679.33; 361/679.38; 361/679.39

(58) Field of Classification Search ............. 361/679.01, 361/679.02, 679.31, 679.32, 679.33, 679.38, 361/679.39
See application file for complete search history.

(56) References Cited

U.S. PATENT DOCUMENTS

| | | | | |
|---|---|---|---|---|
| 5,959,834 A * | 9/1999 | Chang | ....................... | 361/679.31 |
| 7,561,416 B1 * | 7/2009 | Sarraf | ....................... | 361/679.32 |
| 7,719,828 B2 * | 5/2010 | Brown et al. | ............ | 361/679.34 |
| 7,916,465 B2 * | 3/2011 | Chen | ....................... | 361/679.39 |

* cited by examiner

*Primary Examiner* — Anthony Haughton
(74) *Attorney, Agent, or Firm* — Bacon & Thomas, PLLC

(57) ABSTRACT

An electronic device and a retreating apparatus are disclosed. The retreating apparatus comprises at least one moving element, at least one first elastic element, an operating element, and at least one linking element. When the electronic device connects to an external device via connecting interfaces, the retreating apparatus disposed in the electronic device is capable of detaching the external device successfully from the electronic device by different working types.

13 Claims, 7 Drawing Sheets

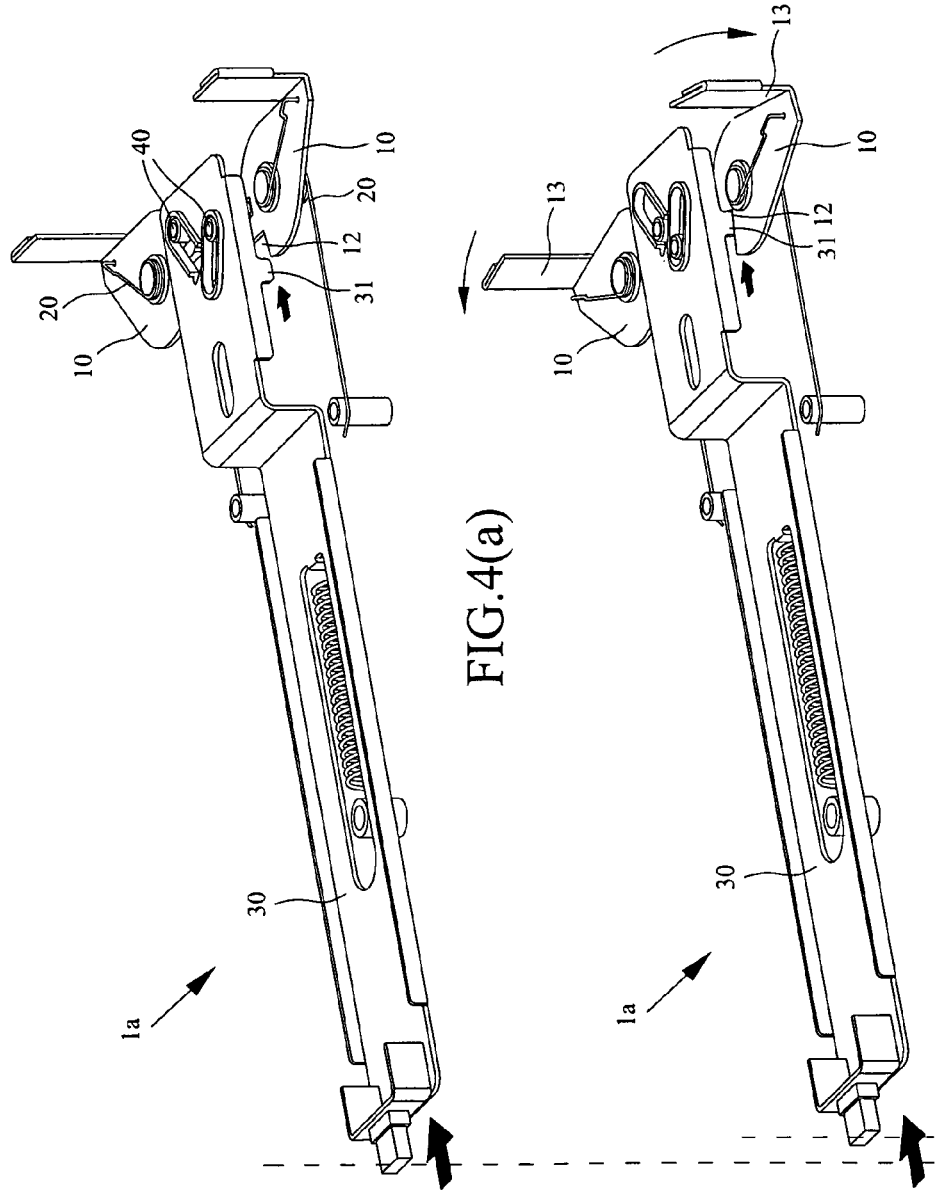

ELECTRONIC DEVICE AND RETREATING APPARATUS THEREOF

BACKGROUND OF THE INVENTION

1. Field of the Invention

The present invention relates to a retreating apparatus; more particularly, it relates to a retreating apparatus capable of successfully detaching an external device from an electronic device.

2. Description of the Related Art

With the arrival of the information age, the usage of computers is increasing, and the size of each type of data file applied in computers is increasing in size. With regard to application software, photo image files or video images, a single file or a file folder may occupy tens or hundreds of megabytes (MB), or even more than 1 gigabyte (GB), of the storage space. Therefore, the development of large-capacity and portable external storage devices (such as hard disk drives or optical disk burners) is advancing quickly to meet user requirements.

An external storage device needs to be electrically connected with a computer or other operating device (such as a playback device) via a connecting interface before it executes a data access function. Conventionally, most users need to directly and manually plug/unplug the external storage device to attach/detach the external storage device to/from an electronic device, but this kind of manipulation is very inconvenient to the users. Therefore, some current electronic are now combined with retreating apparatuses for assisting in detaching such kinds of storage devices. The user needs only to operate the retreating apparatus to generate a linking action via an operating element so as to drive the external storage device to be automatically detached from the electronic device.

However, if the connection between the external storage device and the computer (or the like) is too tight, it is possible that the linking operation may not be successfully achieved due to imprecise assembly among each element of the retreating apparatus, or the external storage device may not be successfully detached from the electronic device due to insufficient force provided by the retreating apparatus. Therefore, the manufacturing process of the assembly of each element should be monitored carefully so as to keep the stability of the detaching function for the retreating apparatus; however, additional manufacturing costs may be incurred by doing so.

Therefore, there is a need to provide an electronic device and retreating apparatus thereof to mitigate and/or obviate the aforementioned problems.

SUMMARY OF THE INVENTION

It is an object of the present invention to provide a retreating apparatus capable of successfully detaching an external device from the electronic device.

To achieve the abovementioned object, a retreating apparatus of an electronic device of the present invention comprises at least one moving element, at least one first elastic element, an operating element, and at least one linking element. Each moving element is combined with the main body of the electronic device and can rotate relative to the main body, and each moving element comprises an engaging part and an opening part. One end of each first elastic element is connected to the main body, and the other end of each first elastic element is connected to the moving element. The operating element is capable of being movably combined with the main body, wherein the operating element comprises at least one protrusion part, and each protrusion part corresponds to each opening part. Each linking element is capable of being movably combined with the operating element, and each linking element comprises an engaging element, whereof each engaging element corresponds to each engaging part. When the electronic device is connected with the external device via a connecting interface, a linking action among each assembly element of the retreating apparatus can be generated by means of operating the retreating apparatus of the present invention so as to provide different working types to rotate each moving element, and the external device can thereby be successfully detached from the electronic device.

The electronic device of the present invention comprises a main body, a connecting interface, and the aforementioned retreating apparatus. The connecting interface is used for correspondingly connecting to the external device. The retreating apparatus is disposed in the main body. By means of operating the retreating apparatus, the external device can be successfully detached from the electronic device of the present invention.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views:

FIGS. 4(a) and 4(b) illustrate schematic drawings showing operational states of the retreating apparatus according to another embodiment of the present invention.

DETAILED DESCRIPTION OF THE PREFERRED EMBODIMENT

Figure 1:
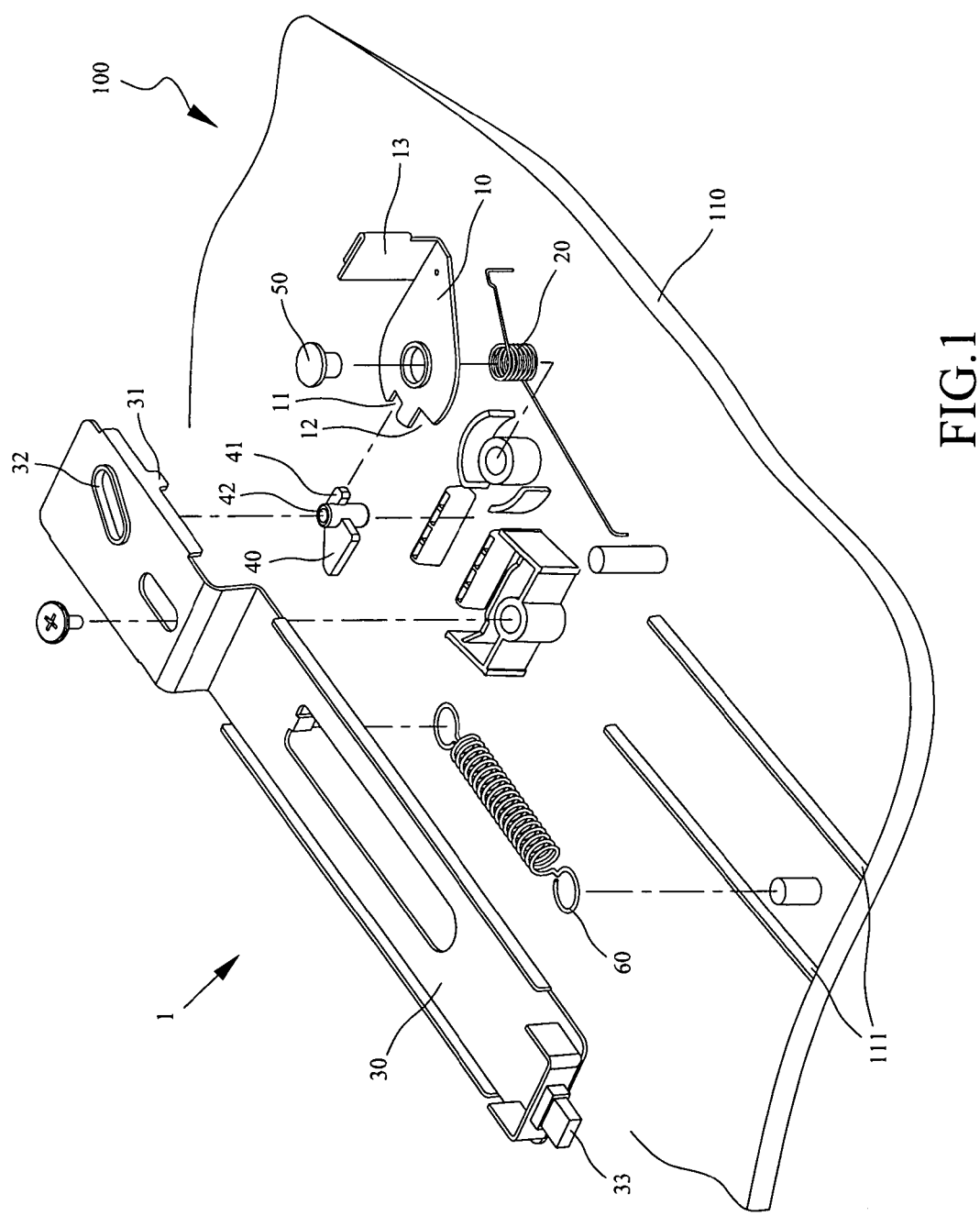
FIG. 1 is an exploded view showing the structure of a retreating apparatus according to the present invention.

Please refer to FIG. 1, which is an exploded view showing the structure of a retreating apparatus 1 according to the present invention. The retreating apparatus 1 of the present invention is applied in an electronic device 100 for detaching an external device (not shown in FIG. 1) connected with the electronic device 100. As shown in FIG. 1, the retreating apparatus 1 of the present invention comprises at least one moving element 10, at least one first elastic element 20, an operating element 30, and at least one linking element 40. In this embodiment, the retreating apparatus 1 of the present invention is in the structural arrangement of one moving element 10, one first elastic element 20, and one linking element 40 for better explanation of its assembly and working types. Please note that the scope of the present invention is not limited to this embodiment.

The moving element 10 comprises an engaging part 11, an opening part 12, and a pushing part 13. The moving element 10 is combined with a main body 110 of the electronic device 100. In this embodiment, the moving element 10 can be combined with the main body 110 via a fixing element 50. The fixing element 50 can be treated as an axis for the moving element 10 to rotate relative to the main body 110, such that the moving element 10 can drive the moving part 13 to rotate together with it upon its rotation.

The first elastic element 20 is disposed underneath the moving element 10. One end of the first elastic element 20 is connected to the main body 110, and the other end of the first elastic element 20 is connected to its corresponding moving element 10, so as to provide the moving element 10 with an elastic force required for rotation.

The operating element 30 comprises a protrusion part 31, a groove 32, and a button part 33. The position of the protrusion part 31 corresponds to that of the opening part 12 of the moving element 10. The operating element 30 is capable of being movably combined with the main body 110. In this embodiment, the retreating apparatus 1 of the present invention further comprises a second elastic element 60. One end of the second elastic element 60 is connected to the main body 110, and the other end of the second elastic element 60 is connected to the operating element 30. Therefore, the second elastic element 60 can provide the operating element 30 with a restoring function after it has been moved. Further, a position-limiting structure 111 can be correspondingly disposed in the main body 110 of the electronic device 100 for limiting the movement of the operating element 30 to the same axial direction.

The linking element 40 comprises an engaging element 41 and a sliding element 42. The engaging element 41 corresponds to the engaging part 11 of the moving element 10. When the engaging element 41 is engaged with the engaging part 11, an engaged state is accordingly formed to limit the rotation of the operating element 10. The linking element 40 is capable of being movably combined with the operating element 30. In this embodiment, the sliding element 42 of the linking element 40 is correspondingly inserted into the groove 32 of the operating element 30. As a result, when the operating element 30 moves, the sliding element 42 will move along the groove 32, and therefore the linking element 40 can be driven to move as well.

Figure 2:
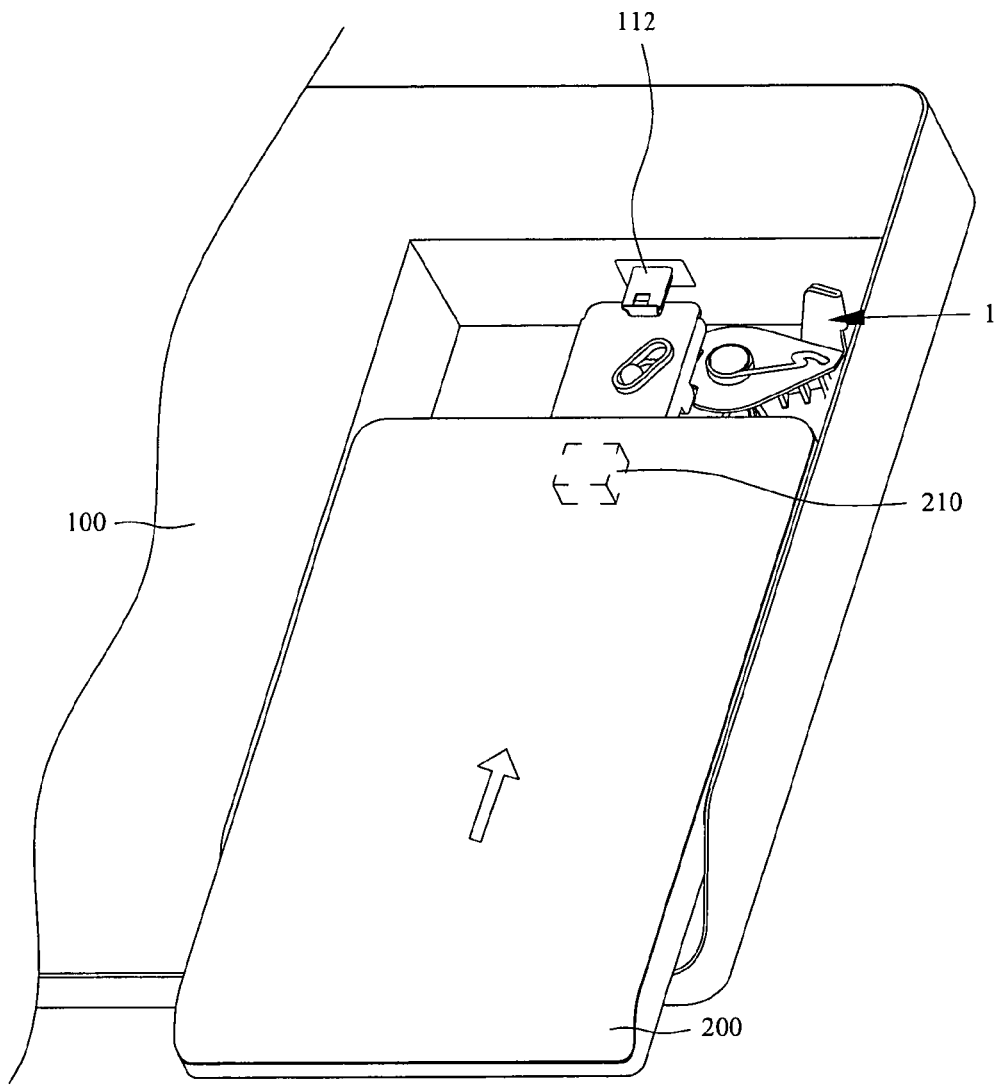
FIG. 2 illustrates a schematic drawing showing an external device combined with an electronic device having the retreating apparatus of the present invention.

Please refer to FIG. 2, which illustrates a schematic drawing showing an external device 200 combined with the electronic device 100 having the retreating apparatus 1 of the present invention. As shown in FIG. 2, the retreating apparatus 1 of the present invention is disposed in the electronic device 100, and the external device 200 can be inserted into a receiving space of the electronic device 100 for being combined with the electronic device 100. The electronic device 100 comprises a connecting interface 112, which corresponds to a corresponding connecting interface 210 of the external device 200. When the external device 200 is combined with the electronic device 100, the connecting interface 112 of the electronic device 100 is correspondingly inserted into the corresponding connecting interface 210 of the external device 210 to form an electrical connection. By means of operating the retreating apparatus 1 of the present invention, the external device 200 can be detached from the electronic device 100. Please refer to the following description for more details about the working types of the retreating apparatus 1 of the present invention.

Please refer to FIG. 3(*a*), which illustrates a schematic drawing showing the retreating apparatus 1 of the present invention when the external device 200 has been combined with the electronic device 100. As shown in FIG. 3(*a*), when the external device 200 (depicted as a frame formed by dotted lines) has been combined with the electronic device 100, the operating element 30 of the retreating apparatus 1 of the present invention remains in an initial position A. At this time, the engaging element 41 of the linking element 40 is correspondingly engaged with the engaging part 11 of the moving element 10, such that the moving element 10 cannot rotate. The protrusion part 31 of the operating element 30 maintains a set distance from the opening part 12 of the moving element 10. In this embodiment, when the operating element 30 is in the initial position A, the distance between the protrusion part 31 and the opening part 12 is approximately the distance from the initial position A to a first position B.

Please refer to FIG. 3(*b*), which illustrates a schematic drawing showing the operation of the retreating apparatus 1 of the present invention during detachment of the external device 200 from the electronic device 100. As shown in FIG. 3(*b*), the external device 200 is combined with the electronic device 100. If the button part 33 of the retreating apparatus 1 of the present invention is pressed, the operating element 30 will be moved from the initial position A to the first position B, and the sliding element 42 of the linking element 40 will move along the groove 32 according to the movement of the operating element 30. Therefore, the linking element 40 will be further driven to shift along the direction of the arrow depicted in solid lines in FIG. 3(*b*). Meanwhile, the engaging element 41 of the linking element 40 will gradually depart from the engaging part 11 of the moving element 10. When the engaging element 41 is completely departed from the engaging part 11, the protrusion part 31 of the operating element 30 is moved to a position close to the opening part 12 of the moving element 10. At this time, the moving element 10 starts to rotate due to an elastic force generated by the first elastic element 20; then the pushing part 13 of the moving element 10 can be driven to rotate. Finally, the pushing part 13 of the moving element 10 rotates to the position shown in FIG. 3(*c*) based on the elastic force, and remains in that position. Therefore, the external device 200 connected with the electronic device 100 can be pushed outwards by means of the pushing part 13, such that the interface connection between the external device 200 and the electronic device 100 can be detached, thereby achieving a detaching effect for the external device 200.

Figure 3A:
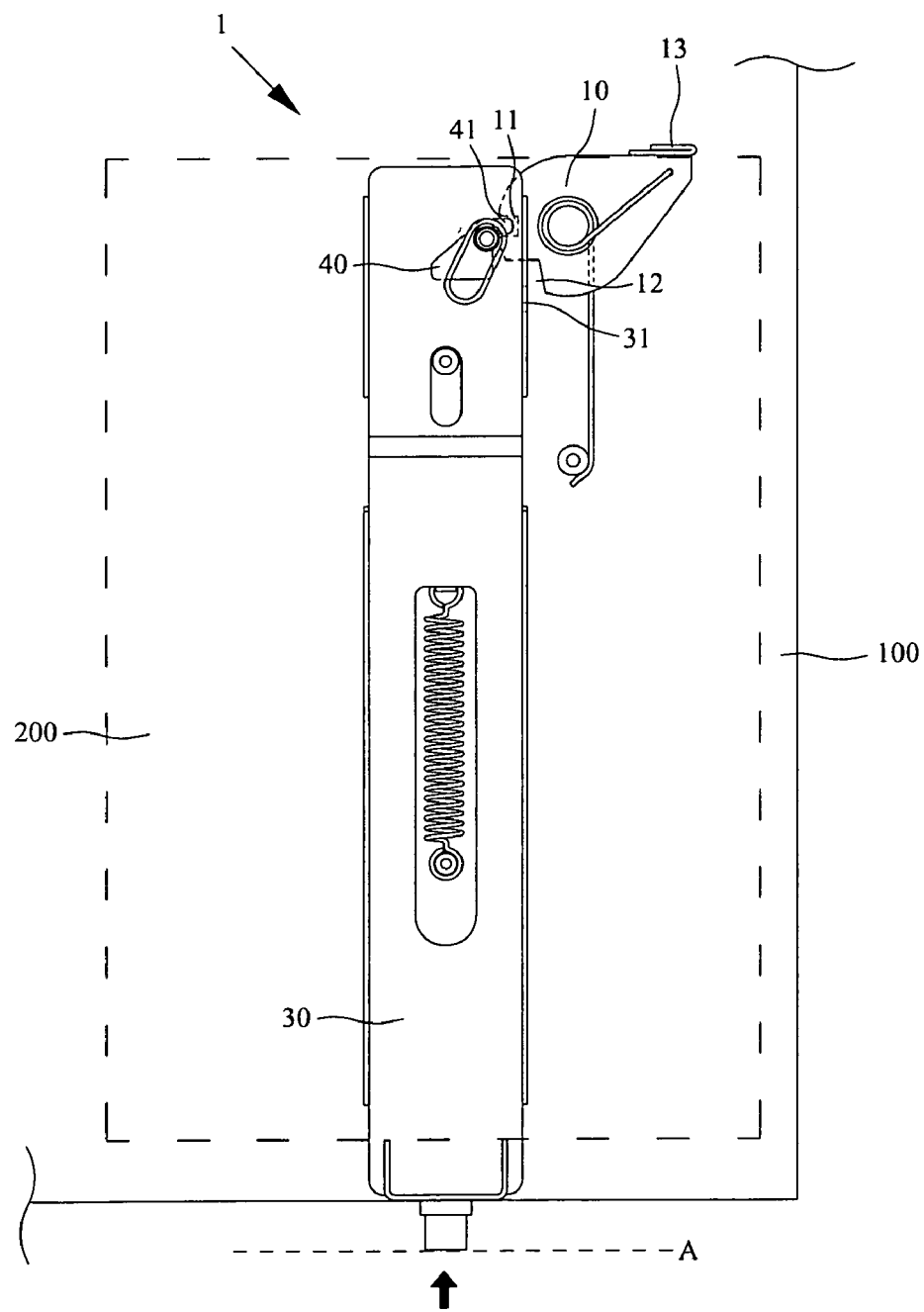
FIG. 3(a) illustrates a schematic drawing showing the retreating apparatus of the present invention when the external device has been combined with the electronic device.
Figure 3B:
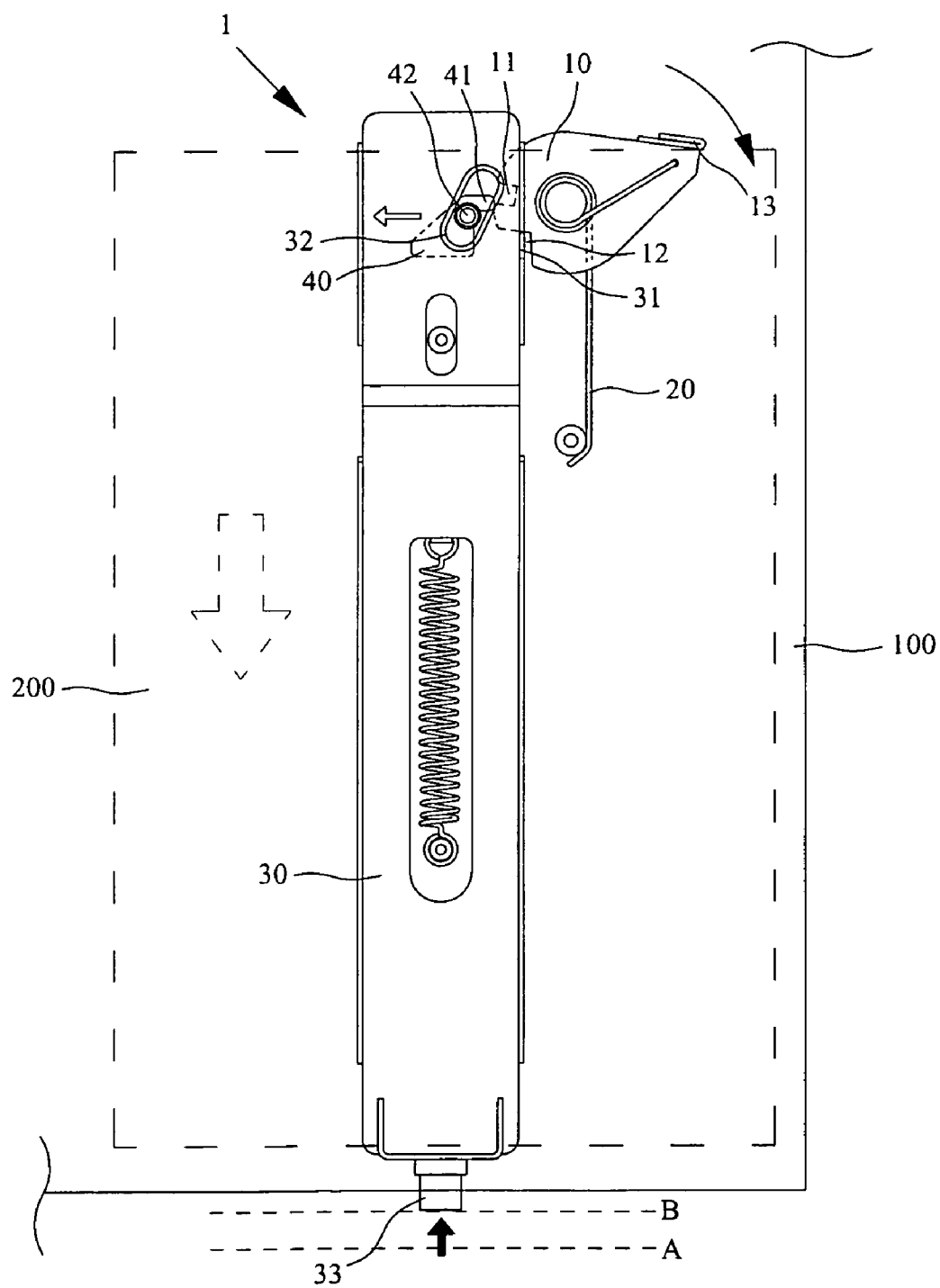
FIG. 3(b) illustrates a schematic drawing showing the operation of the retreating apparatus of the present invention during detachment of the external device from the electronic device.
Figure 3C:
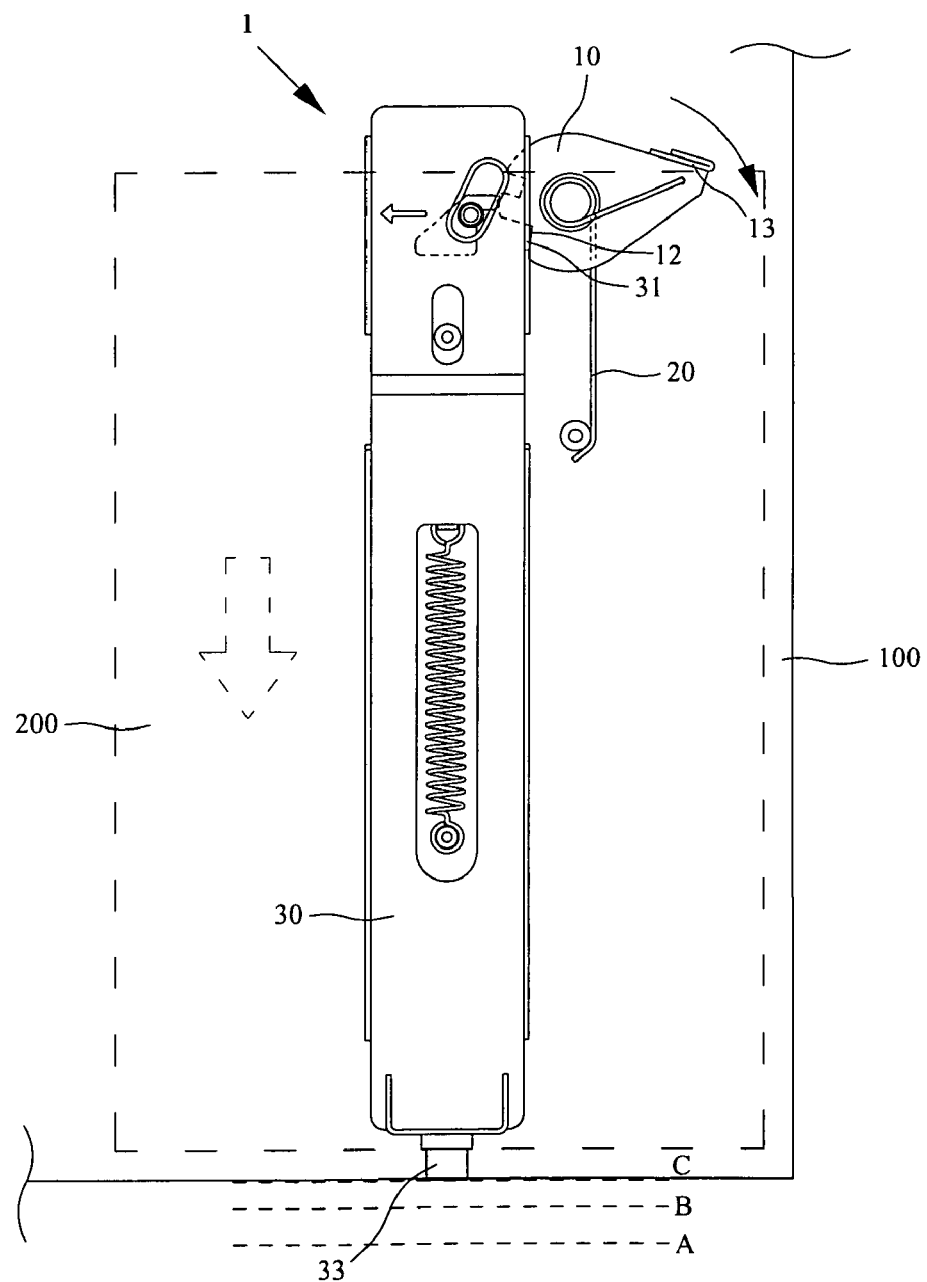
FIG. 3(c) illustrates a schematic drawing showing the operation of the retreating apparatus of the present invention after detachment of the external device from the electronic device.

Please refer to FIG. 3(*c*), which illustrates a schematic drawing showing the operation of the retreating apparatus 1 of the present invention after detachment of the external device 200 from the electronic device 100. When the engaging element 41 parts from the engaging part 11, the moving element 10 might not always be successfully driven to rotate due to lack of the elastic force generated by the first elastic element 20, or due to improper connections among other elements. Thus, the pushing part 13 will not have enough force to push the external device 200. As shown in FIG. 3(*c*), if the above situation occurs, the button part 33 of the retreating apparatus 1 of the present invention can be pressed further so as to make the operating element 30 move from the first position B to a second position C. According to the design of the distance between the above protrusion part 31 and the opening part 12, the protrusion part 31 of the operating element 30 can be utilized to push against the opening part 12 of the moving element 10. The moving element 10 can be driven to rotate according to the additional force added to the operating element 30. Therefore, the external device 200 can be detached from the electronic device 100 via the pushing part 13, so as to facilitate removal of the external device 200 accordingly. At this time, the retreating apparatus 1 of the present invention remains in the position shown in FIG. 3(c).

When the external device 200 is going to be recombined with the electronic device 100, the external device 200 will gradually push against the pushing part 13 during the combination process, so as to drive the moving element 10 to rotate. As a result, the retreating apparatus 1 of the present invention will move according to the sequence of FIG. 3(c), FIG. 3(b) and FIG. 3(a). Finally, when the external device 200 is combined with the electronic device 100, the operating element 30 will move back to the initial position A, and the engaging element 41 of the linking element 40 will be engaged with the engaging part 11 of the moving element 10 again, so as to form the state as shown in FIG. 3(a).

According to the design of the retreating apparatus 1 of the present invention, a 2-stage detaching function can be achieved. First, the operating element 30 is pushed to move from the initial position A to the first position B, so as to utilize the elastic force generated by the first elastic element 20 to automatically drive the pushing element 13 to push the external device 200. If the external device 200 is not successfully retreated, the operating element 30 is further pushed to move from the first position B to the second position C, so as to utilize the operating element 30 to directly drive the pushing element 13 to push the external device according to an external force. Therefore, it is certain that the external device 200 can always be successfully detached from the electronic device 100.

Please refer to both FIG. 4(a) and FIG. 4(b), which illustrate schematic drawings showing operational states of the retreating apparatus 1a according to another embodiment of the present invention. In order to enhance the detaching function of the retreating apparatus 1a of the present invention, two moving elements 10, two first elastic elements 20, and two linking elements 40 are applied in this embodiment, wherein structures and arrangements of the abovementioned identical elements are symmetric, such that each of the moving elements 10 can force the external device at the same time. As shown in FIG. 4(a), in this embodiment, the retreating apparatus 1a of the present invention is in an initial state, and the operating element 30 is in the initial position; therefore, each of the moving elements 10 is engaged by each of the corresponding linking elements 40 and is unable to rotate. Each of the two protrusion parts 31 disposed on two sides of the operating element 30 respectively corresponds to the opening part 12 of each of the moving elements 10, and each protrusion part 31 maintains a set distance from each opening part 12.

As shown in FIG. 4(b), if each moving element 10 cannot successfully rotate to push the external device after the operating element 30 has been moved to the first position, the operating element 30 is then moved towards the second position. At this time, the two protrusion parts 31 of the operating element 30 are respectively utilized to correspondingly push against the opening part 12 of each moving element 10, such that each moving element 10 can drive the pushing part 13 to rotate in order to successfully push the external device. Two points of application force are formed by the two pushing parts 13; therefore, it is easier to detach the external device by means of the retreating apparatus 1a of the present invention.

Figure 5:
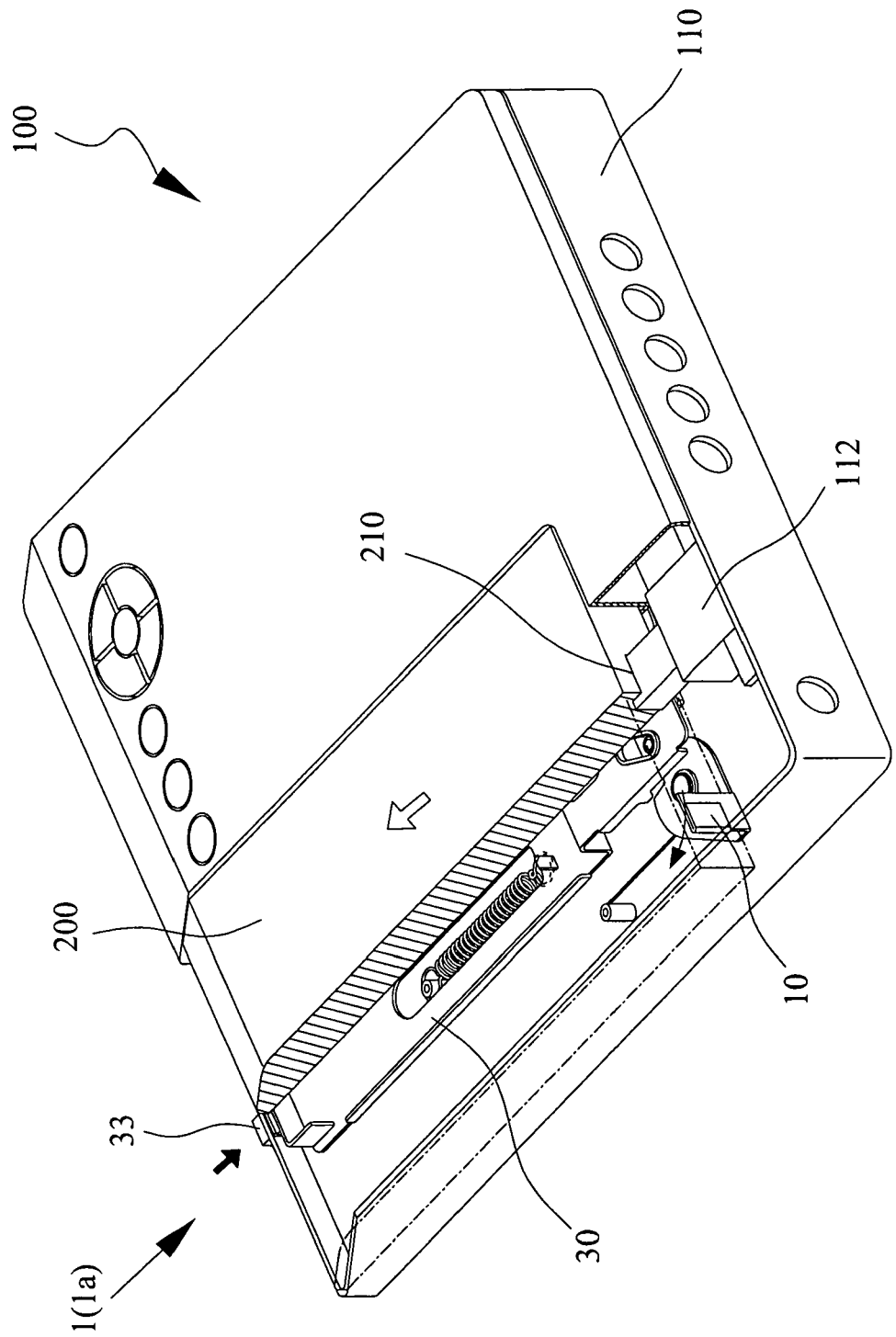
FIG. 5 illustrates a schematic drawing of the electronic device according to the present invention.

Please refer to FIG. 5, which illustrates a schematic drawing of the electronic device 100 according to the present invention. As shown in FIG. 5, the electronic device 100 of the present invention comprises a main body 110, a connecting interface 112, and the aforementioned retreating apparatus 1 or 1a. The connecting interface 112 is used for correspondingly connecting to a corresponding connecting interface 210 of the external device 200. The retreating apparatus 1 or 1a is disposed in the main body 110. The button part 33 of the operating element 30 protrudes from an external surface of the main body 110, thereby facilitating the pressing by a user of the button part 33 to drive the operating element 30. According to a linking mechanism, the moving element 10 can be utilized to push the external device 200, so as to successfully detach the external device 200. In this embodiment, the electronic device 100 is a media player connecting to an external storage device for data transmission. However, the electronic device 100 can also be any kind of equivalent electronic device (such as any kind of portable electronic device) which needs a retreating detachment function for an external device. Furthermore, the external device 200 can be an optical disk drive, a hard disk drive, or other equivalent external device without being limited to the scope of the present invention.

Accordingly, the electronic device 100 of the present invention can utilize the retreating apparatus 1 or 1a to successfully detach the external device 200 connected with the connecting interface 112 of the electronic device 100, so as to improve usage convenience of the electronic device 100 of the present invention.

Although the present invention has been explained in relation to its preferred embodiments, it is to be understood that many other possible modifications and variations can be made without departing from the spirit and scope of the invention as hereinafter claimed.

What is claimed is:

1. A retreating apparatus of an electronic device for detaching an external device connected with the electronic device, the retreating apparatus comprising:
    at least one moving element, wherein each of the moving elements is combined with a main body of the electronic device and can rotate relative to the main body, and each of the moving element comprises an engaging part and an opening part;
    at least one first elastic element, wherein one end of each of the first elastic elements is connected to the main body, and the other end of each of the first elastic elements is connected to the moving element;
    an operating element, capable of being movably combined with the main body, wherein the operating element comprises at least one protrusion part, and each of the protrusion parts corresponds to each of the opening parts; and
    at least one linking element, wherein each of the linking elements is capable of being movably combined with the operating element, and each of the linking elements comprises an engaging element, where each of the engaging elements corresponds to each of the engaging parts;
    wherein when the operating element is moved from an initial position to a first position, the operating element drives each of the linking elements so as to make each of the engaging elements detach from each of the engaging parts in an engaged state, such that each of the moving elements rotates to push the external device by an elastic force generated from each of the first elastic elements; the operating element can be moved from the first position to a second position, so as to move each of the moving elements by means of driving each of the protrusion parts to push against each of the opening parts when the moving element cannot successfully rotate.

2. The retreating apparatus as claimed in claim 1, wherein each of the linking elements further comprises a sliding element inserted correspondingly into a groove of the operating element, such that the sliding element can move along the groove.

3. The retreating apparatus as claimed in claim 1, wherein each of the moving elements further comprises a pushing part used for pushing the external device.

4. The retreating apparatus as claimed in claim 1 further comprising a second elastic element, wherein one end of the second elastic element is connected to the main body, and the other end of the second elastic element is connected to the operating element.

5. The retreating apparatus as claimed in claim 1, wherein when the operating element is in the initial position, the distance between the protrusion part and the opening part is the distance from the initial position to the first position.

6. The retreating apparatus as claimed in claim 1, wherein the movement of the operating element can be limited to the same axial direction via a position-limiting structure of the main body.

7. An electronic device, comprising:
a main body;
a connecting interface for correspondingly connecting to an external device;
a retreating apparatus disposed in the main body, the retreating apparatus comprising:
   at least one moving element, wherein each of the moving elements is combined with the main body and can rotate relatively to the main body, and each of the moving elements comprises an engaging part and an opening part;
   at least one first elastic element, wherein one end of each of the first elastic elements is connected to the main body, and the other end of each of the first elastic elements is connected to the moving element;
   an operating element, capable of being movably combined with the main body, wherein the operating element comprises at least one protrusion part, and each of the protrusion parts corresponds to each of the opening parts; and
   at least one linking element, wherein each of the linking elements is capable of being movably combined with the operating element, and each of the linking elements comprises an engaging element, where each of the engaging elements corresponds to each of the engaging parts;
   wherein when the operating element is moved from an initial position to a first position, the operating element drives each of the linking elements so as to make each of the engaging elements detach from each of the engaging parts in an engaged state, such that each of the moving elements rotates to push the external device by an elastic force generated from each of the first elastic elements; the operating element can be moved from the first position to a second position, so as to move each of the moving elements by means of driving each of the protrusion parts to push against each of the opening parts when the moving element cannot successfully rotate.

8. The electronic device as claimed in claim 7, wherein each of the linking elements further comprises a sliding element inserted correspondingly into a groove of the operating element, such that the sliding element can move along the groove.

9. The electronic device as claimed in claim 7, wherein each of the moving elements further comprises a pushing part used for pushing the external device.

10. The electronic device as claimed in claim 7 further comprising a second elastic element, wherein one end of the second elastic element is connected to the main body, and the other end of the second elastic element is connected to the operating element.

11. The electronic device as claimed in claim 7, wherein when the operating element is in the initial position, the distance between the protrusion part and the opening part is the distance from the initial position to the first position.

12. The electronic device as claimed in claim 7, wherein the operating element further comprises a button part protruding from an external surface of the main body.

13. The electronic device as claimed in claim 7, wherein the main body further comprises a position-limiting structure used for limiting the movement of the operating element to the same axial direction.

* * * * *